United States Patent [19]

Hofmann et al.

[11] Patent Number: 5,606,190
[45] Date of Patent: Feb. 25, 1997

[54] MICROELECTRONIC CIRCUIT STRUCTURE HAVING IMPROVED STRUCTURAL FINENESS AND METHOD FOR MANUFACTURING SAME

[75] Inventors: Karl Hofmann, Putzbrunn; Maximilian Schultz, Weiher, both of Germany

[73] Assignee: Siemens Aktiengesellschaft, Munich, Germany

[21] Appl. No.: 246,170

[22] Filed: May 19, 1994

[30] Foreign Application Priority Data

May 19, 1993 [DE] Germany ............... 43 16 855.8

[51] Int. Cl.$^6$ ............... H01L 27/20; H01L 29/76
[52] U.S. Cl. ............... 257/316; 257/254; 257/325; 250/492.1
[58] Field of Search ............... 257/254, 316, 257/325; 250/492

[56] References Cited

U.S. PATENT DOCUMENTS 4,672,408   6/1987   Togei ............... 257/316
5,047,649   9/1991   Hodgson et al. ............... 250/492

OTHER PUBLICATIONS

G. Binnig et al., "Atomic Force Microscope", Physical Review Letters, vol. 56, No. 9 (1986), pp. 930–933.
M. A. McCord et al., "Lithography with the Scanning Tunneling Microscope", J. Vac. Sci. Technol. B, vol. 4, No. 1, (1986), pp. 86–88.
V. Licharew et al., "Elektronick mit einzelnen Elektronen", Spektrum der Wissenschaft, (1992), pp. 62–63 and 65–67.
V. Corcoran, "Nanotechnik", Spektrum der Wissenschaft, (1991), pp. 76–86.
"Formation of quantum wires and quantum dots on InSb utilizing the Schottky effect", by C. Sikorski, J. Vac. Sci, Technol., Jul./Aug. 1990, vol. 8, No. 4, pp. 625–629.
"Electron Gas in Semiconductor Multiple Quantum Wires, Spatially Indirect Optical Transitions", by J. S. Weiner et al., Physical Review Letters, vol. 63, No. 15, pp. 1641–1644.
"Gain–Enhanced LDD MNOS Device Using Cesium Implantation", by James R. P:fiester et al., IEEE Transactions on Electron Devices, Jun. 1992, vol. 39, No. 6, New York, pp. 1469–1476.

Primary Examiner—Mahshid Saadat
Assistant Examiner—Valencia Martin Wallace
Attorney, Agent, or Firm—Hill, Steadman & Simpson

[57] ABSTRACT

A microelectronic circuit structure has a semiconductor layer and a dielectric layer that are arranged neighboring one another. The dielectric layer comprises a charge distribution localized close to the boundary surface to the semiconductor layer which effects a shift of the local semiconductor surface potential in the semiconductor layer. The charge distribution, in particular, is non-uniform in the plane parallel to the boundary surface to the semiconductor layer so that the shift of the local semiconductor surface potential is effected in a limited region. Structures having dimensions down to 10 nm can thereby be produced by driving charge carriers into the dielectric layer in the electrical field between a pointed metal tip and the semiconductor layer.

17 Claims, 6 Drawing Sheets

MICROELECTRONIC CIRCUIT STRUCTURE HAVING IMPROVED STRUCTURAL FINENESS AND METHOD FOR MANUFACTURING SAME

BACKGROUND OF THE INVENTION

1. Field of the Invention

The present invention is directed generally to microelectronics and more specifically to a microelectronic circuit structure and method for manufacturing same.

2. Description of the Related Art

In semiconductor technology, microelectronic components and circuits are defined in the lateral direction by insulation structures and/or potential barriers. The possibilities for miniaturizing these components and circuits are therefore linked to the fineness that can be achieved in the structuring methods used for manufacturing insulation structures and potential barriers.

This is true for both conventional components such as, for example, MOSFETs or MODFETs as well as for new component designs of nanoelectronics. Quantum-mechanical effects are utilized in these components of nanoelectronics at dimensions around 10 nm (see, for example, K. K. Likharev et al, Spektrum der Wissenschaft, August 1992, pages 62–67 and E. Corcoran, Spektrum der Wissenschaft, January 1991, pages 76–86). Conductive boundary surface or quantum well channels are generated in semiconductor structures by lateral structuring, wherein two-dimensional electron or hole gases form. These are quantized in a vertical direction. A lateral quantization is added given further miniaturization of the dimensions, as a result whereof quantum wire or quantum dot structures occur. Also, quantum-mechanical tunneling through thin, lateral potential barriers that are arranged between neighboring structures are also utilized in nanoelectronics.

For lateral structuring of semiconductors, it is known to utilize lithography methods in combination with corresponding structure transfer methods. The most significant structure transfer methods are layer deposition, etching methods and doping methods. X-ray, electron and ion beam lithography are mainly employed for producing structures having lateral dimensions below 0.1 μm. Structures down to 30 nm can be produced with electron beam lithography. The suitability of lithography, deposition and surface modification methods using scanning, tunneling microscopes and atomic force microscopes for achieving even smaller structures is the subject of investigations (see, for example, M. A. McCord et al, J. Vac. Sci. Tech. Vol. 4 (1) pages 86–88 (1986); and G. Binnig et al, Phys. Rev. Lett. 56, pages 930 f (1986).

In addition to being limited by the resolution of the lithography used, the structural fineness is limited by regions in the semiconductor produced by doping in that implantation regions in the semiconductor diverge in the required activation by curing.

SUMMARY OF THE INVENTION

An object of the present invention is to provide a microelectronic circuit structure that can be manufactured with structural fineness in the region of 10 nm. Further, a method for the manufacture thereof is also provided.

The subject structure of the invention has at least one semiconductor layer and one dielectric layer that are arranged neighboring one another. The electrical layer has an electrical charge distribution close to the boundary surface to the semiconductor layer that effects a shift of the local semiconductor surface potential in the semiconductor layer. For example, the charge distribution is produced by fixed positive and/or negative electrical charges in the dielectric layer. The shape and expanse of the region in the semiconductor layer wherein the shift of the local semiconductor surface potential is effected by the electrical field of the charge distribution is predetermined by the charge distribution in the dielectric layer. Two-dimensional boundary surface channels and/or local potential barriers can be produced at the surface of the semiconductor layer in this way. In the microelectronic circuit structure of the invention, the course of potential in the semiconductor layer is set by the electrical charge distribution in the dielectric layer. By contrast thereto, the course of the potential in semiconductor layers of traditional components is set by a charge distribution in the semiconductor layer itself, the doping.

In an embodiment of the invention, a gate electrode is oriented on the surface of the dielectric layer. The shift of the local semiconductor surface potential in the semiconductor layer is controllable via this gate electrode.

The lateral structure of boundary surface channels or potential barriers at the surface of the semiconductor layer effected by the charge distribution is dependent on the dimension of the dielectric layer as well as on the position, expanse and size of the charges that form the electric charge distribution. Further, the structure is influenced by the presence of a gate electrode as well as by the voltage applied to the gate electrode. Finally, the structure is dependent on the doping, on the substrate bias and on the material structure of the semiconductor layer.

The microelectronic circuit structure of the invention can operate both as a conventional component, for example a MOSFET, as well as a component in the sense of nanoelectronics. In particular, the circuit structure of the invention can be applied to quantum well channel structures.

It is especially advantageous to provide larger circuit structures, which are composed of a plurality of circuit elements connected to one another via interconnects as a circuit structure of the invention. In this case, the interconnects that connect the individual circuit elements are likewise produced by a corresponding course of the electric charge distribution in the dielectric layer.

The semiconductor layer in the circuit structure of the invention is preferably applied on monocrystalline silicon or a Group III–V semiconductor. The semiconductor layer can thereby be part of a semiconductor substrate. It is especially advantageous to use the silicon layer of an SOI substrate as the semiconductor layer. In this case, the neighboring circuit structures can easily be isolated from one another.

The charge distribution in the dielectric layer is inventively produced by localized charges in the dielectric layer. For example, positively charged metal ions such as, for example, potassium, cesium and rubidium are suitable as charges. Further, it is possible to load charged carrier traps located at the boundary surface by charge carrier injection. For example, tungsten ions implanted into $SiO_2$ are suitable as the trap. These are designationally loaded with electrons in a localized fashion. It also lies within the framework of the invention to construct the dielectric layer of three layers, whereby the middle layer is a higher capture cross-section for charge carriers than the two outer layers. The two outer layers form a potential barrier against the flow of charge carriers out of the middle layer. The thickness of the outer layer neighboring the semiconductor layer is thereby set such that the charge distribution of charge carriers captured in the middle layer effects the shift of the local semiconductor surface potential in the semiconductor layer. The two outer layers are formed, for example, of $SiO_2$, whereas the middle layer is formed of $Si_3N_4$ or $Al_2O_3$.

An embodiment of the invention provides that the dielectric layer has a ferroelectric layer. By local polarization of the ferroelectric layer, a collection of polarization charges arises at the edge of the ferroelectric layer. These cause an electrical field that results in a shift of the local semiconductor surface potential in the semiconductor layer.

An embodiment of the invention provides for manufacturing the microelectronic circuit structure to drive charge carriers into the dielectric layer by applying a local electrical field. For manufacturing circuit structures having dimensions below 100 nm, it is advantageous to generate the electrical field in that a metal tip is directed onto the surface of the dielectric layer at a location at which charged carriers are to be driven in, and in that an electrical voltage is applied between the metal tip and the semiconductor layer. The tip of an atomic force or scanning tunneling microscope is particularly suitable as a metal tip for achieving superfine structures. These tips can generate fields above $10^6$ V/cm having lateral dimensions in the region of 10 nm. It can be exactly positioned with a precision of 1 nanometer with piezo manipulators.

It is advantageous to drive the charged carriers in at a temperature higher than the temperature at which the circuit structure is to be operated. The mobility of charge carriers to be driven in is thereby increased and lower electrical fields are required for drive-in. When the dielectric layer comprises a ferroelectric layer, then it lies within the framework of the invention to likewise implement the local polarization of the ferroelectric layer with the assistance of a metal tip, particularly of an atomic force or scanning tunneling microscope.

The invention shall be set forth in greater detail below with reference to exemplary embodiments and to the figures.

DETAILED DESCRIPTION OF THE PREFERRED EMBODIMENTS

Figure 1:
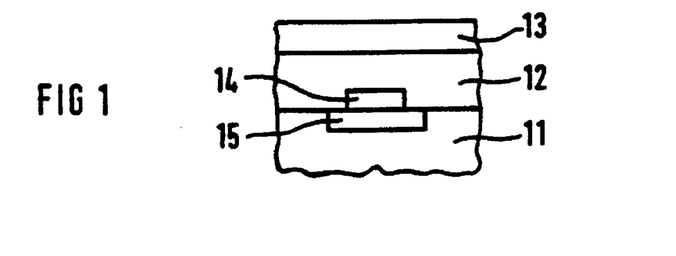
FIG. 1 shows a circuit structure of the present invention having a dielectric layer and a semiconductor layer, whereby charges are arranged such that in the dielectric layer a local electron channel is produced in the semiconductor layer.
Figure 2:
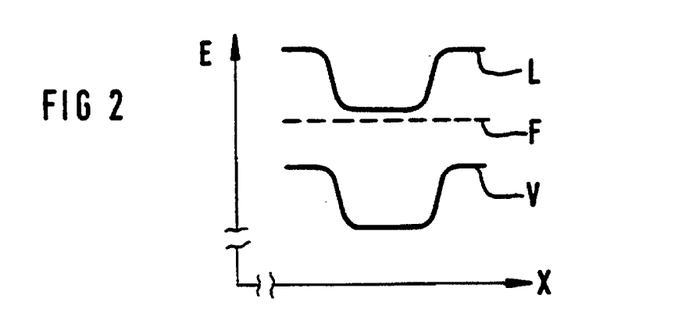
FIG. 2 shows the curve of the potential of the circuit structure of the invention shown in FIG. 1.

In an embodiment of the present invention, a dielectric 12 of, for example, $SiO_2$ is oriented at the surface of a semiconductor layer 11 of monocrystalline silicon, for example, (see FIG. 1). A gate electrode of, for example, doped polysilicon is arranged on the dielectric layer 12. The semiconductor layer is, for example, p-doped. The dielectric layer has a thickness of, for example, 10 nm. Positive charge carriers 14 are in the dielectric layer 12 close to the boundary surface of the semiconductor layer 11. The positive charge carriers 14 are at a distance of, for example, 2 nm from the boundary surface to the semiconductor layer 11. The distribution of the positive charge carriers 14 has a width parallel to the boundary surface to the semiconductor layer 11 of, for example, 10 nm. A density of, for example, 10 $\mu C/cm^2$ is achieved in the distribution of the positive charged carriers 14. The electric field of the distribution of the positive charge carriers 14 effects a shift of the surface potential in the adjoining surface of the semiconductor layer. As a result thereof, the formation of a local electron channel 15 in the semiconductor layer 11 arises by joining the distribution of the positive charge carriers 14. FIG. 2 shows the curve of potential of the circuit structure shown in FIG. 1. The conduction band is referenced L, the Fermi level is referenced F and the valence band is referenced V.

Figure 3:
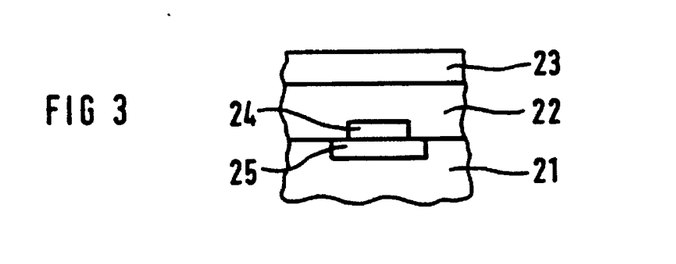
FIG. 3 shows a circuit structure of the invention having a dielectric layer and a semiconductor layer wherein a depletion zone is generated in the semiconductor layer by charges arranged in the dielectric layer.
Figure 4:
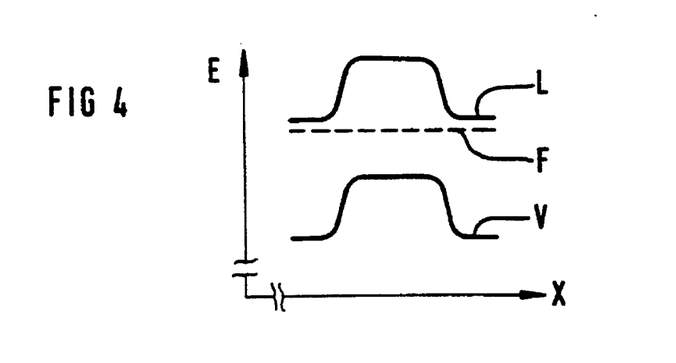
FIG. 4 shows the curve of potential of the circuit structure of the invention shown in FIG. 3.

A dielectric layer 22 of, for example, $SiO_2$ is arranged at the surface of a semiconductor layer 21 of, for example, p-doped, monocrystalline silicon (see FIG. 3). A gate electrode of, for example, doped polysilicon is at the surface of the dielectric layer 22. Negative charge carriers 24 are in the dielectric layer 22. The negative charge carriers 24 are situated close to the boundary surface to the semiconductor layer 21. The distribution of the negative charge carriers 24 has an expanse of, for example, 2 nm perpendicularly relative to the surface of the semiconductor layer 21. The distribution of the negative charge carriers 24 parallel to the surface of the semiconductor layer 21 has, for example, an expanse of approximately 10 nm. The density of the negative charge carriers is, for example, 10 $\mu C/cm^2$. The electric field of the distribution of the negative charge carriers 24 effects a shift of the surface semiconductor potential in the surface of the semiconductor layer 21. This shift of the surface semiconductor potential leads to a depletion zone 25 in the semiconductor layer. Conduction band L, Fermi level F and valence band V of the circuit structure shown in FIG. 2 are shown in FIG. 4.

Figure 5:
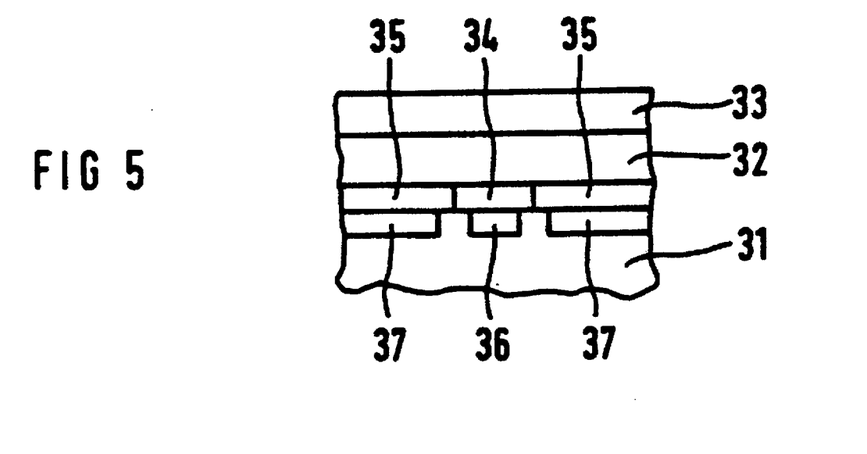
FIG. 5 shows a circuit structure of the invention having a dielectric layer and a semiconductor layer, whereby localized negative and positive charges in the dielectric layer generate an electron channel or a hole barrier in the semiconductor layer.
Figure 6:
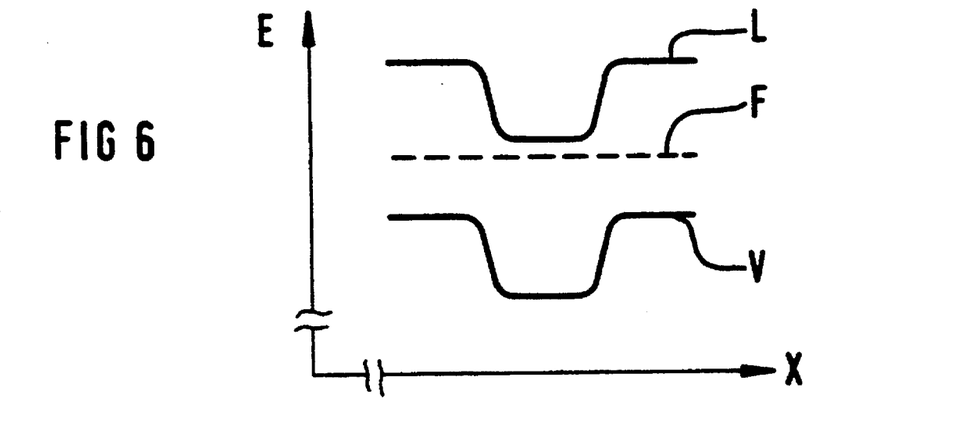
FIG. 6 shows the curve of the potential of the circuit structure of the invention shown in FIG. 5.

A dielectric layer 32 of, for example, $SiO_2$ is at the surface of a semiconductor layer 31 of, for example, p-doped, monocrystalline silicon. The dielectric layer 32 has a thickness of, for example, 10 nm. A gate electrode 33 of, for example, doped polysilicon is at the surface of the dielectric layer 32. Positive charge carriers are in a first region 34 in the dielectric layer 32. Negative charge carriers are in a second region 35. The negative charge carriers and the positive charge carriers are each respectively at a distance of, for example, 2 nm from the surface of the semiconductor layer 31. The first region 34 has a width of, for example, 10 nm parallel to the surface of the semiconductor layer 39. A second region 35 adjoins the first region 34 at opposite sides. The charge carrier density in the first region 34 is 10 μC/cm² and also 10 μC/cm² in the second region 35. The electrical field of the negative and positive charge carriers causes the formation of an electron channel 36 in the semiconductor layer 31. This electron channel 36 neighbors the first region 34. Inside of the electron channel 36, the electric field of the positive and negative charge carriers causes the formation of hole channels 37. The electron channel 36 simultaneously represents a potential barrier for holes. Conduction band L, Fermi level F and valence band V of the circuit structure shown in FIG. 5 are shown in FIG. 6.

In applications wherein a control of the shift of the semiconductor surface potential in the semiconductor layer 15 by using the gate electrode is not required, the gate electrode in the circuit structures set forth with reference to FIGS. 1, 3 and 5 can be eliminated.

By reversing the operational signs of the charge carriers in the embodiments set forth with reference to FIGS. 1–6, the electron channels become hole channels and the electron barriers become hole barriers or vice-versa.

Figure 7:
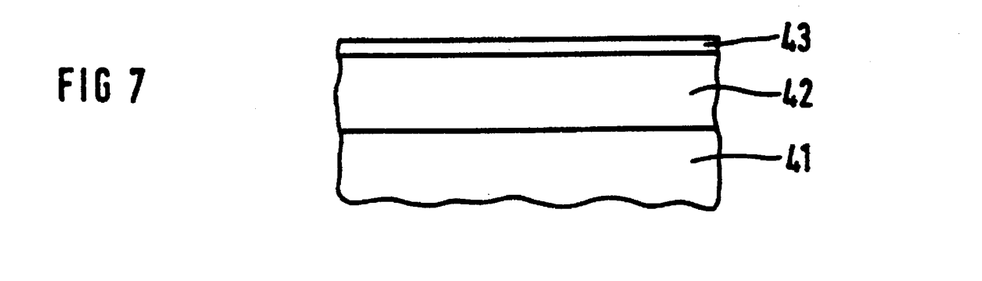
FIGS. 7–9 show the manufacture of a circuit structure of the invention.

For manufacturing a circuit structure of the invention, a dielectric layer 42 of, for example, $SiO_2$ is applied onto a semiconductor layer 41 of, for example, monocrystalline silicon (see FIG. 7). The dielectric layer 42 has a thickness of, for example, 10 nm. A substance 42 containing metal ions is applied onto the surface of the dielectric layer 42. For example, potassium, rubidium or cesium are used as metal ions. For example, alkali salts (for example, halides) are suitable as the substance.

Figure 8:
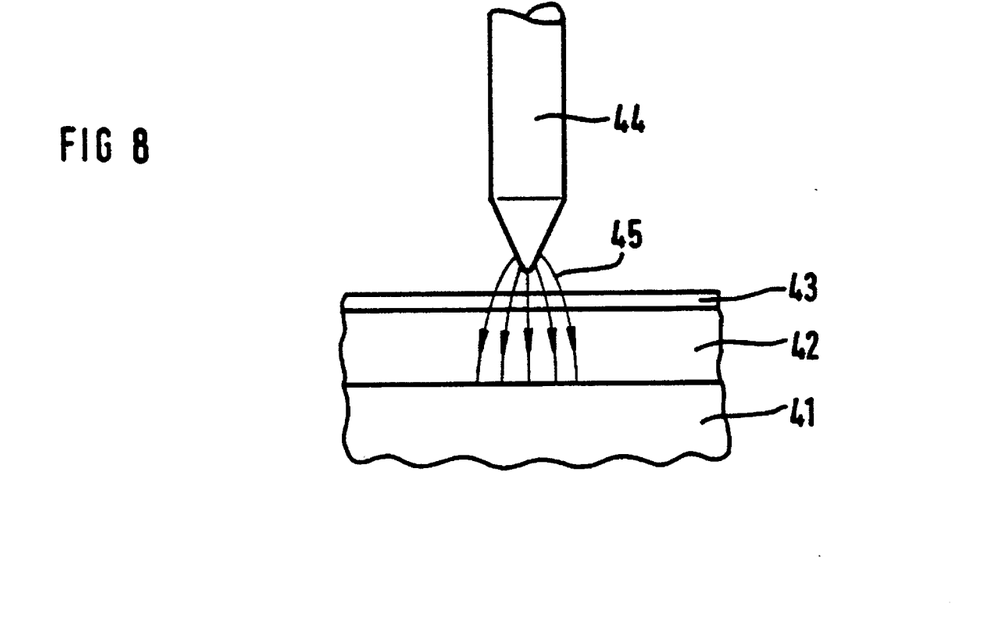

A tip 44 of an atomic force microscope or scanning tunneling microscope is directed onto the surface of the dielectric layer 42 covered with the substance 42 (see FIG. 8). The tip 44 is connected to a positive voltage. The semiconductor layer 41 is connected to ground potential. The tip 44 is brought to a distance of approximately 0–10 nm from the surface of the dielectric layer 42. By applying a positive voltage from 1–50 volts to the tip 44, an electrical field 45 is generated that causes an ion drift of the metal ions in the direction toward the boundary surface between the dielectric layer 42 and the semiconductor layer 41. The ion drift preferably occurs at elevated temperature, for example at 400 Kelvin. At a few 100 Kelvin above room temperature, potassium, rubidium and cesium have a mobility that is higher by orders of magnitude. At room temperature, these metal ions no longer move in $SiO_2$. The electrical field 45 effects a collection of positive metal ions 46 in the proximity of the boundary surface to the semiconductor layer 41. The collection of positive metal ions 46 has a surface density of, for example, $10^{13}$ cm$^{-2}$. The substance 43 remaining at the surface of the dielectric layer 42 is removed (see FIG. 9). The distribution of the positive metal ions 46 no longer changes at room temperature since the mobility of the metal ions is greatly reduced at this temperature.

Figure 9:
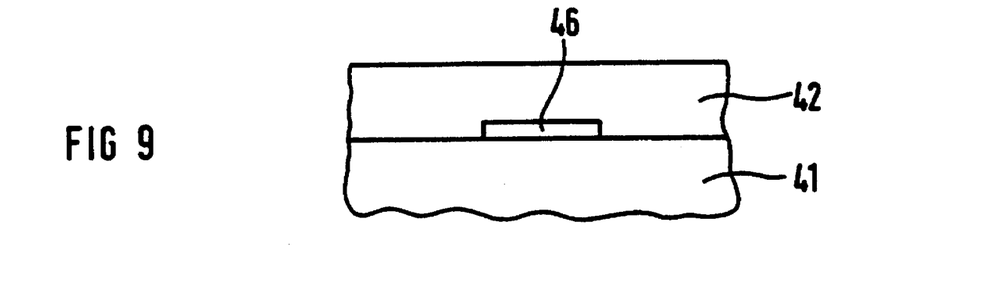

Alternatively, the substance 43 can be generated in the surface of the dielectric layer by local deposition of the doped material or by ion implantation with or without lithography into the surface. For finishing the circuit structure, a gate electrode is applied as needed onto the surface of the dielectric layer 42.

Figure 10:
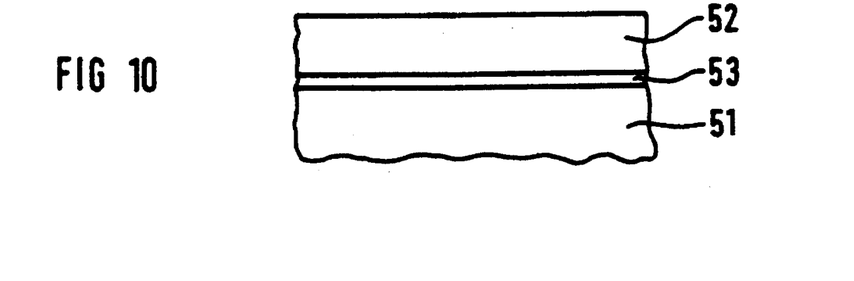
FIGS. 10–12 show the manufacture of a non-uniform charge distribution in a dielectric layer of the invention.

For producing complementary circuit structures, a dielectric layer 52 is applied onto a semiconductor layer 51. This dielectric layer 52 has a layer with positive charge carriers 53 at the boundary surface to the semiconductor layer 51. The semiconductor layer 51 is, for example, p-doped, monocrystalline silicon. The dielectric layer is, for example, $SiO_2$ and has a thickness of, for example, 10 nm. The layer 51 doped with positive charge carriers is manufactured, for example, by surface-wide ion implantation with positively-charged ions or by surface-wide occupation with metal ions and subsequent, surface-wide drive-in in the electrical field (see FIG. 10).

Figure 11:
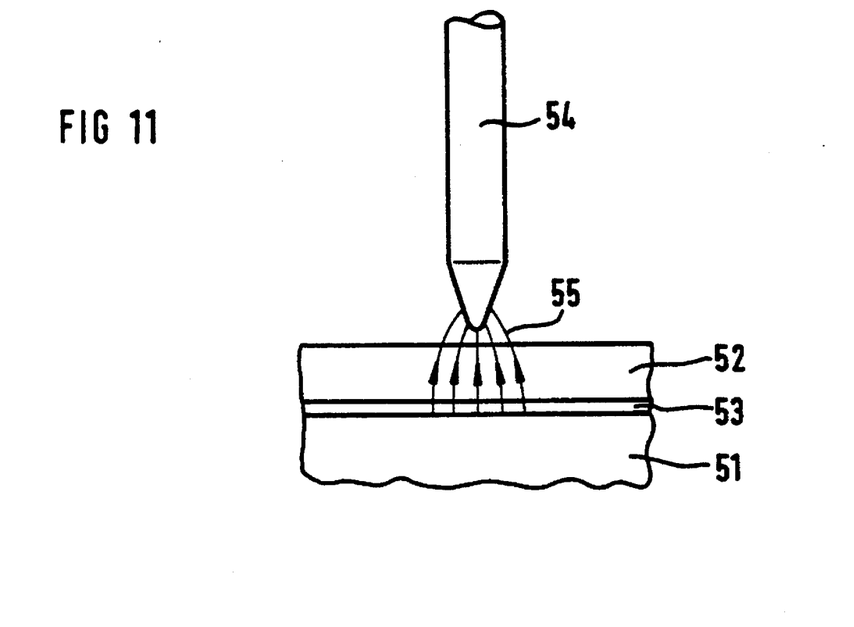
Figure 12:
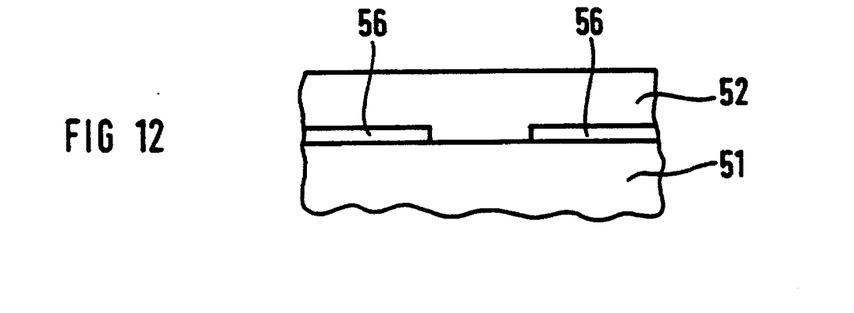

In another embodiment, a tip 54 of an atomic force microscope or scanning tunneling microscope is directed onto the surface of the dielectric layer 52. The tip 54 is connected to a positive voltage of, for example, 1–50 volts. The semiconductor layer 51 is connected to ground potential (see FIG. 11). As a result thereof, an electrical field 55 is formed in which an ion drift of the positive charge carriers ensues from the layer 53 toward the surface of the dielectric layer 52. In this way, the positive charge carriers are removed from the boundary surface to the semiconductor layer 51. After removal of the drifted, positive charged carriers of the dielectric layer 52, for example by being etched off or with a solvent, only positive charge carriers outside the electrical field caused by the tip 54 are still present in the dielectric layer 52 at the boundary surface to the semiconductor layer 51.

Figure 13:
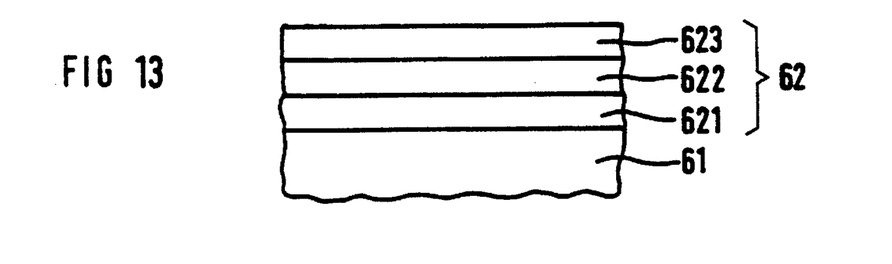
FIGS. 13–15 show the negative loading of traps in a dielectric layer that is composed of three layers of the invention.

A dielectric layer 62 is applied onto the surface of a semiconductor layer 61 of, for example, monocrystalline silicon (see FIG. 13). The dielectric layer 62 has a first layer 621 of, for example, $SiO_2$. A second layer 622 that, for example, of $Si_3N_4$ or of $Al_2O_3$ is on the first layer 621. A third layer 623, for example, of $SiO_2$ is at the surface of the second layer 622. The dielectric layer 622 has an overall thickness of approximately 10 nm. For example, 3 nm thereof devolve onto the first layer 621, 3 nm onto the second layer 622 and 4 nm onto the third layer 623. Charge carrier traps are oriented at the boundary surface between the first layer 621 and the second layer 622 by doping with tungsten with a dopant concentration of, for example, $10^{14}$–$5 \times 10^{15}$ cm$^{-2}$.

In another embodiment, a tip 64 of an atomic force microscope or scanning tunneling microscope is directed onto the surface of the dielectric layer 62. This tip is connected to a positive voltage (see FIG. 14). The semiconductor layer 61 is connected to ground potential. As a result thereof, an electrical field 65 arises in that the traps at the boundary surface between the first layer 621 and the second layer 622 are loaded with electrons into field emission from the tip 64. As a result thereof, a region 66 having negative charge carriers is formed at the boundary surface between the first layer 621 and the second layer 622 (see FIG. 15). The negative charge carriers are firmly localized in the dielectric layer 62 by the traps. The structure of the dielectric layer 62 in this embodiment is comparable to the dielectric layers used in non-volatile memories. The spatial expanse of the region 66 having the firmly-localized, negative charge carriers parallel to the surface of the semiconductor layer 61 can be set in this way in the region of 10 nm. A charge density up to a few μC/cm², for example 2 μC/cm² is achieved in this region.

Figure 15:
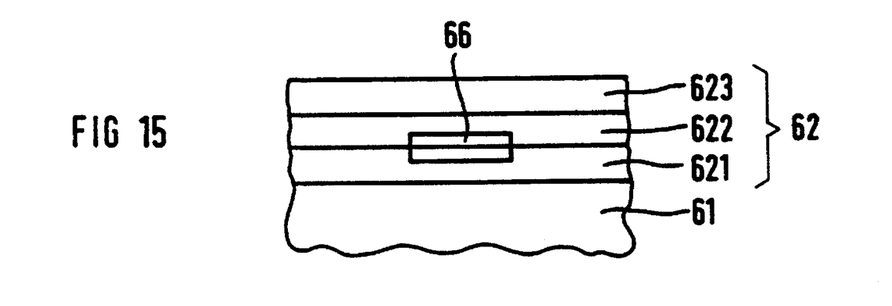

Since $Si_3N_4$ and $Al_2O_3$ have high volume and boundary surface trap densities of up to $10^{19}$ cm$^{-2}$, the tungsten doping can be forgone in applications wherein long-term reliability is not required. The circuit structure, however, becomes extremely reliable as a result of the tungsten doping, since holding times of charge carriers of a few hundred years are achieved. The first layer 621 should be thick enough in order to suppress a discharge of the traps by direct tunneling into the semiconductor layer 61.

Figure 14:
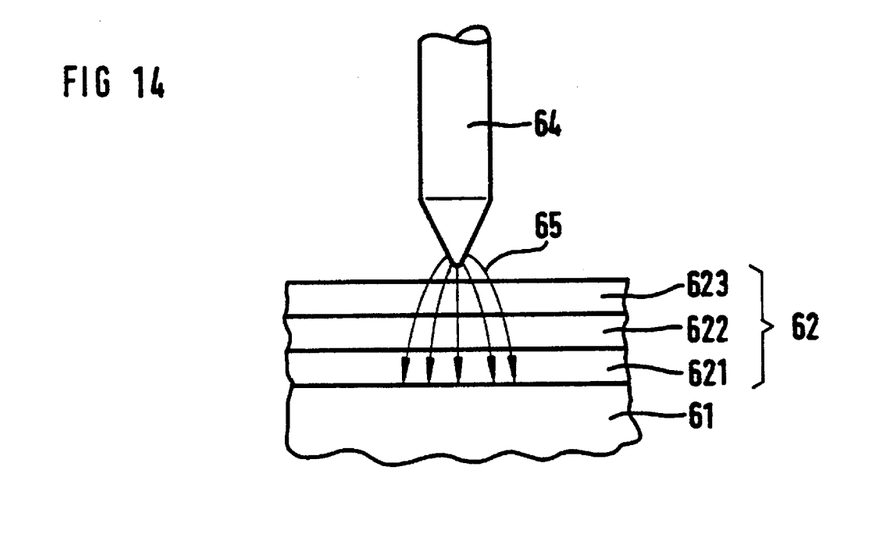

Analogous to the method set forth with reference to FIGS. 13–15, traps loaded with holes can be generated in a dielectric layer of, for example, SiO$_2$ by local field emission injection (Fowler-Nordheim tunnel) of holes or electrons from the semiconductor layer.

Figure 16:
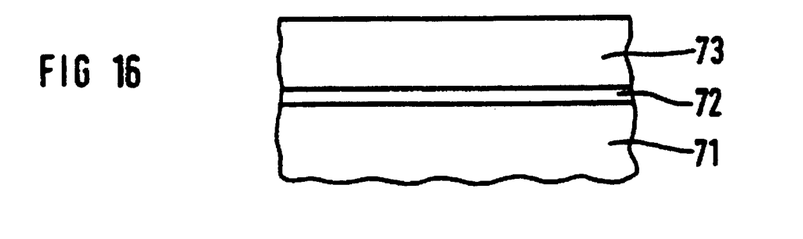
FIGS. 16–18 show the polarization of a ferroelectric layer for generating the charged distribution in a dielectric layer of the invention.

A SiO$_2$ layer 72 that, for example, is 2 nm thick is applied onto a semiconductor layer 71 of, for example, monocrystalline silicon (see FIG. 16). An unpolarized, ferroelectric layer 73 is applied onto the SiO$_2$ layer 72. The ferroelectric layer is, for example, BaTiO$_3$, Pb (Zr, Ti) O$_3$ or (Pb, La) (Zr, Ti) O$_3$. The ferroelectric layer 73 has a thickness of, for example, 8 nm.

In another embodiment, a tip 74 of an atomic force microscope or scanning tunneling microscope is directed onto the surface of the ferroelectric layer 73. A local polarization of the ferroelectric layer 73 is undertaken using the tip 74. As a result thereof, a separation of the polarization charges arises in a region 75 of the ferroelectric layer 74. Caused by the direction of the polarization field, negative charges are collected in the proximity of the boundary surface to the SiO$_2$ layer 72, whereas positive polarization charges are driven to the surface of the ferroelectric layer (see FIG. 17).

Figure 17:
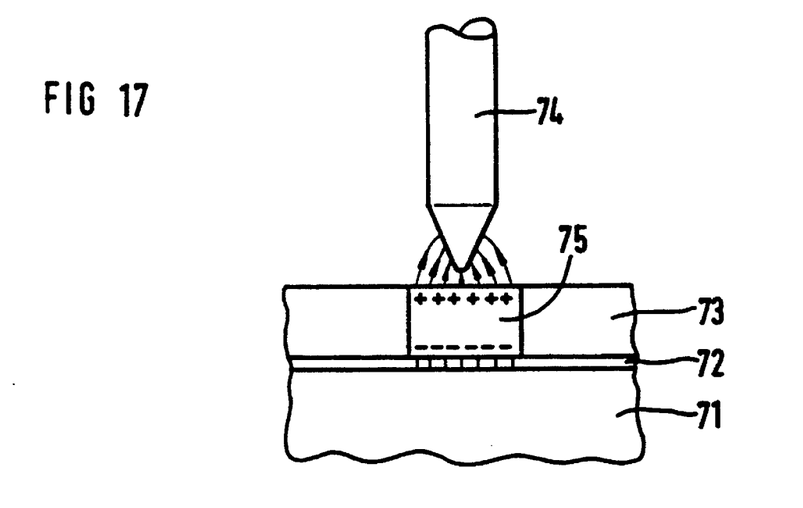
Figure 18:
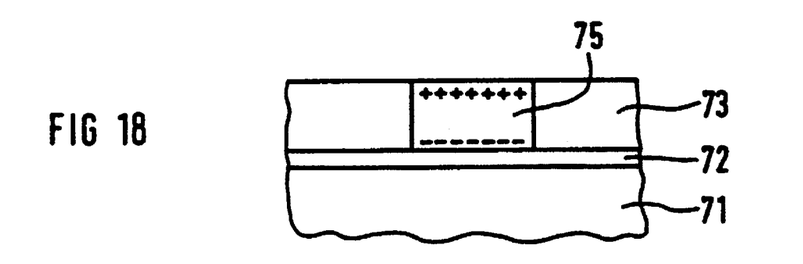

After the removal of the tip 74, a permanent polarization remains in the region 75. The negative polarization charges arranged at the boundary surface to the SiO$_2$ layer 72 effect a shift of the local surface potential in the surface of the semiconductor layer 71. For finishing the circuit structure, the surface of the ferroelectric layer can be provided with a gate electrode. Charge carrier densities of a few 10 µC/cm$^2$ are achieved as a result of the polarization.

Care must be exercised in the selection of the ferroelectric for the ferroelectric layer so that the ferroelectric used has an adequately high polarization, coercive field strength, Curie temperature and slight relaxation and leakage currents.

Structures having dimensions around 10 nm have been described above in the exemplary embodiments. The circuit structure of the invention and the manufacturing methods that have been set forth, however, can also be utilized for larger structures, for example having micrometer dimensions.

The production of the electrical charge distribution in the dielectric layer can also be implemented by using sharply limited electron or ion emission and by lithography or deposition methods upon utilization of electron, ion or photon beams.

The circuit structures can also be utilized for other semiconductor/insulator combinations, for heterostructure quantum well channels or for structures without a gate electrode.

Although the invention has been described with respect to preferred embodiments, it is not to be so limited as changes and modifications can be made therein which are within the full intended scope as defined by the appended claims.

I claim:

1. Microelectronic circuit structure, comprising:
   at least one semiconductor layer, a dielectric layer and a gate electrode, wherein the at least one semiconductor layer and the dielectric layer are arranged neighboring one another forming a boundary surface therebetween, the boundary surface having a surface potential;
   said dielectric layer comprises an electrical charge distribution having a maximum charge storage density of 1–100 µc/cm$^2$ having localized close to the boundary surface to effect a shift of the local semiconductor surface potential in the semiconductor layer;
   wherein said gate electrode is arranged on the surface of the dielectric layer above the electrical charge distribution such that said shift is controllable via the gate electrode.

2. Microelectronic circuit structure according to claim 1, wherein said semiconductor layer is doped.

3. Microelectronic circuit structure according to claim 1, wherein said charge distribution is non-uniform in a plane parallel to said boundary surface to said semiconductor layer, so that said charge distribution shifts the local semiconductor surface potential in a limited region of the surface of said semiconductor layer.

4. Microelectronic circuit structure according to claim 1, wherein said dielectric layer comprises a ferroelectric, and wherein said charge distribution results from a polarization of said ferroelectric.

5. Microelectronic circuit structure according to claim 4, wherein said dielectric layer comprises at least one amorphous layer formed of a material selected from a group consisting of: BaTi$_3$, PbZr$_3$, PbTi$_3$, LaTi$_3$, and LaZr$_3$.

6. Microelectronic circuit structure according to claim 4, wherein said dielectric layer comprises at least one polycrystalline layer formed of a material selected from a group consisting of: BaTi$_3$, PbZr$_3$, PbTi$_3$, LaTi$_3$, and LaZr$_3$.

7. Microelectronic circuit structure according to claim 1, wherein said charge distribution comprises negative and positive electrical charge carriers.

8. Microelectronic circuit structure according to claim 1, wherein said charge distribution comprises positive electrical charge carriers.

9. Microelectronic circuit structure according to claim 1, wherein said charge distribution comprises negative electrical charge carriers.

10. Microelectronic circuit structure according to claim 1, wherein said charge distribution comprises charge carriers and wherein said dielectric layer comprises a layer sequence having three layers, with a first layer oriented immediately adjacent to said semiconductor layer, a second layer oriented immediately adjacent to said first layer and a third layer oriented immediately adjacent to said second layer, said second layer having a higher capture cross-section for said charge carriers than that of said first layer and said third layer;
   said first layer and said third layer forming a potential barrier against said charge carriers flowing from said second layer; and
   said first layer having a thickness such that said charge distribution of charge carriers captured in said second layer shifts the local semiconductor surface potential in said semiconductor layer.

11. Microelectronic circuit structure according to claim 10, wherein said first layer and said third layer comprise SiO$_2$, and wherein said second layer comprises Si$_3$N$_4$.

12. Microelectronic circuit structure according to claim 10, wherein said first layer and said third layer comprise SiO$_2$, and wherein said second layer comprises Al$_1$O$_3$.

13. Microelectronic circuit structure according to claim 10, wherein said first layer has a thickness in a range between 3 and 10 nm, said second layer has a thickness in a range between 3 and 10 nm, and said third layer has a thickness in a range between 3 and 10 nm.

14. Microelectronic circuit structure according to claim 7, further comprising traps having charge carriers for the formation of said charge distribution oriented in said dielectric layer and said traps having an increased capture cross-section for charge carriers in comparison to that of the remaining part of said dielectric layer.

15. Microelectronic circuit structure according to claim 14, wherein said traps result from a doping with tungsten.

16. Microelectronic circuit structure according to claim 1, wherein said semiconductor layer is monocrystalline silicon.

17. Microelectronic circuit structure according to claim 16, wherein said semiconductor layer is a portion of an SOI substrate.

* * * * *